United States Patent
Wu et al.

(10) Patent No.: US 8,933,745 B2
(45) Date of Patent: Jan. 13, 2015

(54) TRANSCONDUCTANCE-ENHANCING PASSIVE FREQUENCY MIXER

(75) Inventors: Jianhui Wu, Nanjing (CN); Xiao Shi, Nanjing (CN); Chao Chen, Nanjing (CN); Zhilin Liu, Nanjing (CN); Qiang Zhao, Nanjing (CN); Junfeng Wen, Nanjing (CN); Xudong Wang, Nanjing (CN); Chunfeng Bai, Nanjing (CN); Qian Tian, Nanjing (CN)

(73) Assignee: Southeast University, Nanjing (CN)

( * ) Notice: Subject to any disclaimer, the term of this patent is extended or adjusted under 35 U.S.C. 154(b) by 0 days.

(21) Appl. No.: 13/980,355

(22) PCT Filed: May 29, 2012

(86) PCT No.: PCT/CN2012/076193
§ 371 (c)(1),
(2), (4) Date: Jul. 18, 2013

(87) PCT Pub. No.: WO2013/091351
PCT Pub. Date: Jun. 27, 2013

(65) Prior Publication Data
US 2013/0285715 A1    Oct. 31, 2013

(30) Foreign Application Priority Data
Dec. 20, 2011    (CN) .......................... 2011 1 0428630

(51) Int. Cl.
G06G 7/12       (2006.01)
H03H 11/04      (2006.01)
H03D 7/14       (2006.01)

(52) U.S. Cl.
CPC ......... *H03H 11/0466* (2013.01); *H03D 7/1441* (2013.01); *H03D 7/1466* (2013.01)
USPC ........... 327/355; 327/113; 327/359; 327/361; 455/323

(58) Field of Classification Search
USPC ......... 327/108–112, 379, 389, 391, 355–361; 326/22–27
See application file for complete search history.

(56) References Cited

U.S. PATENT DOCUMENTS 6,542,019 B1 *   4/2003   Lim et al. ............... 327/359
8,018,267 B2 *   9/2011   Kang et al. ............. 327/359
(Continued)

FOREIGN PATENT DOCUMENTS

CN    102111109 A1    6/2011
CN    102163954 A1    8/2011
CN    102412786 A1    4/2012

OTHER PUBLICATIONS

Research and Progress of SSE, vol. 31, No. 2, "A Passive Down Mixer Integrated in SDR Receivers" dated Apr. 2011, by Dechao Meng, et al.

*Primary Examiner* — Brandon S Cole
(74) *Attorney, Agent, or Firm* — Miller Law Group, PLLC

(57) ABSTRACT

A transconductance-enhancing passive frequency mixer comprises a transconductance amplification stage, a frequency mixing stage, and an output transresistance amplifier. The transconductance amplification stage has a pre-amplification transconductance-enhancing structure, so that the transconductance is greatly enhanced, thereby obtaining the same transconductance value at a lower bias current. A radio-frequency current is modulated by the frequency mixing stage to generate an output mid-frequency current signal. The mid-frequency current signal passes through the transresistance amplifier, to form voltage output, and finally obtain a mid-frequency voltage signal. The transresistance amplifier has a transconductance-enhancing structure, thereby further reducing input impedance, and improving current utilization efficiency and port isolation. The frequency mixer has the characteristics of low power consumption, high conversion gain, good port isolation, and the like.

15 Claims, 3 Drawing Sheets

(56) References Cited

U.S. PATENT DOCUMENTS

| | | |
|---|---|---|
| 8,089,309 B2* | 1/2012 | Jansen et al. .................. 327/359 |
| 2005/0124311 A1* | 6/2005 | Mahmoudi et al. ........... 455/323 |
| 2006/0152838 A1* | 7/2006 | Fitzgerald et al. .............. 360/46 |
| 2006/0261875 A1* | 11/2006 | Breems et al. ................. 327/359 |
| 2008/0001633 A1* | 1/2008 | Narathong et al. ............. 326/87 |
| 2009/0085642 A1* | 4/2009 | Li et al. ......................... 327/355 |
| 2010/0301920 A1* | 12/2010 | Wu ................................ 327/359 |
| 2011/0095807 A1* | 4/2011 | de Jong et al. ................ 327/361 |
| 2011/0316631 A1* | 12/2011 | Rafi .............................. 330/277 |
| 2013/0135029 A1* | 5/2013 | Xu et al. ....................... 327/355 |
| 2013/0300490 A1* | 11/2013 | Wu et al. ....................... 327/355 |

\* cited by examiner

Transconductance stage in the circuit of the present invention $i_{RF} = i_{RF}(p) + i_{RF}(n) = g_{mp}v_{RF} + A_0 g_{mn}v_{RF}$ Transconductance stage in classic frequency mixer structure $i_{RF} = g_{mp}v_{RF}$

TRANSCONDUCTANCE-ENHANCING PASSIVE FREQUENCY MIXER

FIELD OF THE INVENTION

The present invention relates to a transconductance enhanced passive frequency mixer, which comprises a transconductance stage with enhanced transconductance, a passive frequency mixing switch pair, and an output transresistance amplifier. The transconductance amplification stage employs a pre-amplified transconductance enhancement structure, so that the transconductance is greatly enhanced, and thereby the same transconductance value can be achieved at lower bias current; intermediate frequency (IF) current signal output is generated from radio frequency (RF) current under the modulation action of the frequency mixer stage. Voltage output is generated via a transresistance amplifier, and finally IF voltage signal is obtained. The transresistance amplifier employs a transconductance enhancement structure, so that the input impedance is further decreased, and current utilization and port isolation are improved. The frequency mixer structure has advantages such as low power consumption, high conversion gain, and high port isolation, etc.

BACKGROUND OF THE INVENTION

Conventional Gilbert frequency mixers have balanced indexes and high port isolation, and operate reliably. However, as the requirement for single-chip of RF receivers increases and the RF technology advances, sometimes the performance of conventional Gilbert frequency mixers can not meet the present demand in many actual applications. For example, in the case that the frequency mixer stage employs an active frequency mixing structure, the flicker noise will have some adverse effect in zero IF receiver structure; if a passive frequency mixing structure can be employed, the flicker noise will be greatly decreased since a passive frequency mixer does not have quiescent current; in addition, the linearity of passive frequency mixer is usually higher than the linearity of active frequency mixer.

In the classic frequency mixing structure, as depicted in FIG. 1A, when RF voltage is converted into RF current in the transconductance stage, the transconductance value is limited and the conversion gain is low at low bias current, because the signal received by the receiver is generally low and the transconductance is only the transconductance of the input transistor in the conventional structure. It will be of great significance for performance improvement of the entire frequency mixer if higher transconductance value can be achieved at the same bias current in the transconductance stage by one approach. Based on that ideal, a novel transconductance circuit structure is designed successfully in the present invention; as a result, the transconductance value in the circuit of transconductance stage is greatly enhanced.

For the output stage of a passive frequency mixer, the input resistance of the transresistance amplifier in the output stage must be decreased as far as possible, owing to considerations of a series of problems, such as port isolation, linearity, and conversion gain, etc. In the present invention, the object is attained by means of a transresistance amplifier that employs a transconductance enhancement structure.

SUMMARY OF THE INVENTION

Technical Problem

The object of the present invention is to provide a passive frequency mixer with a transconductance enhanced transconductance stage, in which the same transconductance value can be achieved at lower bias current and IF current signal is output and generated from RF current under the modulation action of the frequency mixer stage. Voltage output is generated via a transresistance amplifier, and finally IF voltage signal is obtained. The transresistance amplifier employs a transconductance enhancement structure, so that the input impedance is further decreased, and current utilization and port isolation are improved. The frequency mixer structure has advantages such as low power consumption, high conversion gain, and high port isolation, etc.

Technical Solution

The object of the present invention is attained with the following solution: a frequency mixer, which usually comprises a transconductance stage, a frequency mixer stage, and a load output stage. In a conventional frequency mixer, the circuit structure of the transconductance stage is simple, the transconductance gain is low, and the transconductance is usually the transconductance value $g_{mp}$, as shown in FIG. 1A. RF signal is converted into RF current through the transconductance stage, the RF current generates down-converted signal at intermediate frequency at the output terminal under the modulation action of the frequency mixer stage, and then the down-converted signal is converted into voltage signal through the load output stage. In that process, it will be greatly helpful for improvement of conversion gain and noise performance in the frequency mixer if higher current signal can be obtained at the output terminal of the transconductance stage. A transconductance stage circuit with transconductance enhancement function is designed in the passive frequency mixer disclosed in the present invention. FIG. 1B shows the voltage-current conversion relationship in the circuit structure after transconductance is enhanced. The working principle will be detailed below.

In the transconductance enhanced passive frequency mixer of the present invention, as shown in FIG. 2, the RF current signal outputted from points A and B in the transconductance stage is coupled to the frequency mixer stage, converted through a frequency conversion process by a frequency mixing switch, and then enters into the transresistance amplifier. Viewed from the source terminal of PM6, the resistance of the circuit in the load stage is very low in the output frequency band, because the circuit in the load stage employs a transconductance enhanced common-gate input structure. When the signal frequency is relatively low, with the extremely low equivalent input resistance of PM6 and PM7, the output points A and B in the transconductance stage is equivalent to AC ground for low frequency signal output, and therefore the oscillation amplitude of IF signal is as low as possible at the port; thus the isolation between IF port and RF port is improved. Likewise, for input RF signal, with a capacitor C7 connected to the frequency mixing output terminal, the points A and B in the transconductance stage is equivalent to AC ground; thus, the oscillation amplitude of RF voltage at the node is decreased, and current utilization and linearity are improved. A resonant network composed of L0 and C4 is connected between the gate electrodes of NM0 and NM1 in the transconductance stage, and the resonant of the parallel resonant network is near the input RF frequency; thus, the resonant network can inhibit IF and low frequency signals from gain and thereby ensures stability of the positive feedback transconductance enhancement circuit. In the input frequency band, with the AC short circuit effect of capacitor C7 and low on-state resistance of the switch pair, the transconductance enhancement circuit creates a low-impedance node in the positive feedback loop, and ensures that the gain of the positive feedback loop at the frequency is lower than 1, and thereby ensures stability. The transconductance enhancement function is implemented as follows: for RF signal near 2.4 GHz, suppose the positive and negative inputs of RF signal are $+v_{RF}$ and $-v_{RF}$ respectively. The absolute value of gain of amplifier tubes PM0 and PM1 at points C and D is $A_0$, then the current flowing through resistor R2 is $g_{mp}v_{RF}$ (suppose the transconductance value of all PM tubes is $g_{mp}$), and the current direction is drawn out of point A; the negative terminal of RF signal passes through PM1, amplified to $A_0v_{RF}$ at point D, coupled to the gate electrode of NM0 via C3, and converted to current $A_0g_{mn}v_{RF}$ at the drain electrode of NM0, and the current direction is also drawn out of point A; then, the sum of RF current drawn out of point A is $g_{mp}V_{RF}+A_0g_{mn}v_{RF}$. In the meanwhile, point B has RF current of the same size, and the direction is injected into point B; wherein, the resistor R4 and R5 are used to balance the phase delay of the current generated from the drain electrodes of PM0 and PM1 after the current flowing through R2 and R3. Here, a differential RF current output is generated between point A and B, and is coupled to the switch frequency mixer stage via C5 and C6; the output stage employs transconductance enhancement technology and can generate low input impedance in the output frequency band; the IF current obtained through frequency mixing is completely drawn into the load stage, and finally IF output voltage is generated in the output load by means of a current mirror.

In the transconductance enhanced passive frequency mixer of the present invention, capacitors C5 and C6 are connected in series between the transconductance stage and the frequency mixer stage to block the effect of DC signal. The output from the frequency mixer stage is connected to a capacitor C7, so as to filter off the high-frequency signal after frequency mixing. The output IF signal is amplified through the load stage. FIG. 3 shows the waveform (low-amplitude low-frequency sinusoidal wave) at the output terminal without transconductance gain structure and the waveform (high-amplitude low-frequency sinusoidal wave) at the output terminal with transconductance gain structure, wherein, the local oscillation frequency is 2.45 GHz; it is seen clearly from FIG. 3: the conversion gain is greatly increased owing to the improvement of transconductance structure.

Beneficial Effects the transconductance stage of the transconductance enhanced passive frequency mixer can increase the RF current converted from RF input voltage. The main working principle is: the current is multiplied with the local oscillator signal via a passive dual balance switch pair, so as to accomplish frequency mixing function. The switch stage employs a passive frequency mixing method, and does not have static power consumption, and eliminates flicker noise from switch stage. The output stage employs transconductance enhancement technology, and can generate low input impedance in the output frequency band; the IF current obtained through frequency mixing is completely drawn into the load stage, and finally IF output voltage is generated in the output load by means of a current mirror. The output terminal of the frequency mixer stage is connected to a capacitor, so that the output terminal is equivalent to AC ground for the RF signal from the transconductance stage; thus, the RF current generated in the transconductance stage can be drawn into the frequency mixing switch as much as possible. Since the transresistance stage has low input impedance, the IF voltage fluctuation at the input terminal of the transresistance stage is very low; thus, voltage feeding of IF signal to the output terminal of transconductance stage is reduced, the output voltage of transconductance stage is stabilized, and current utilization and linearity are improved. The transconductance enhanced passive frequency mixer described above has advantages such as high transconductance in the transconductance stage, low power consumption, and high conversion gain.

DETAILED DESCRIPTION OF THE EMBODIMENTS

Figures 1A, 1B:
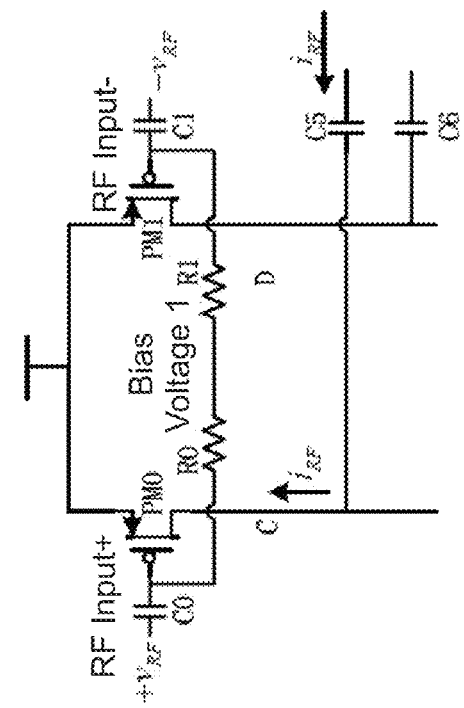
FIG. 1A is a schematic diagram of the transconductance stage in the known classic frequency mixer structure.
FIG. 1B is a schematic diagram of the transconductance enhancement part of the present invention.
Figure 2:
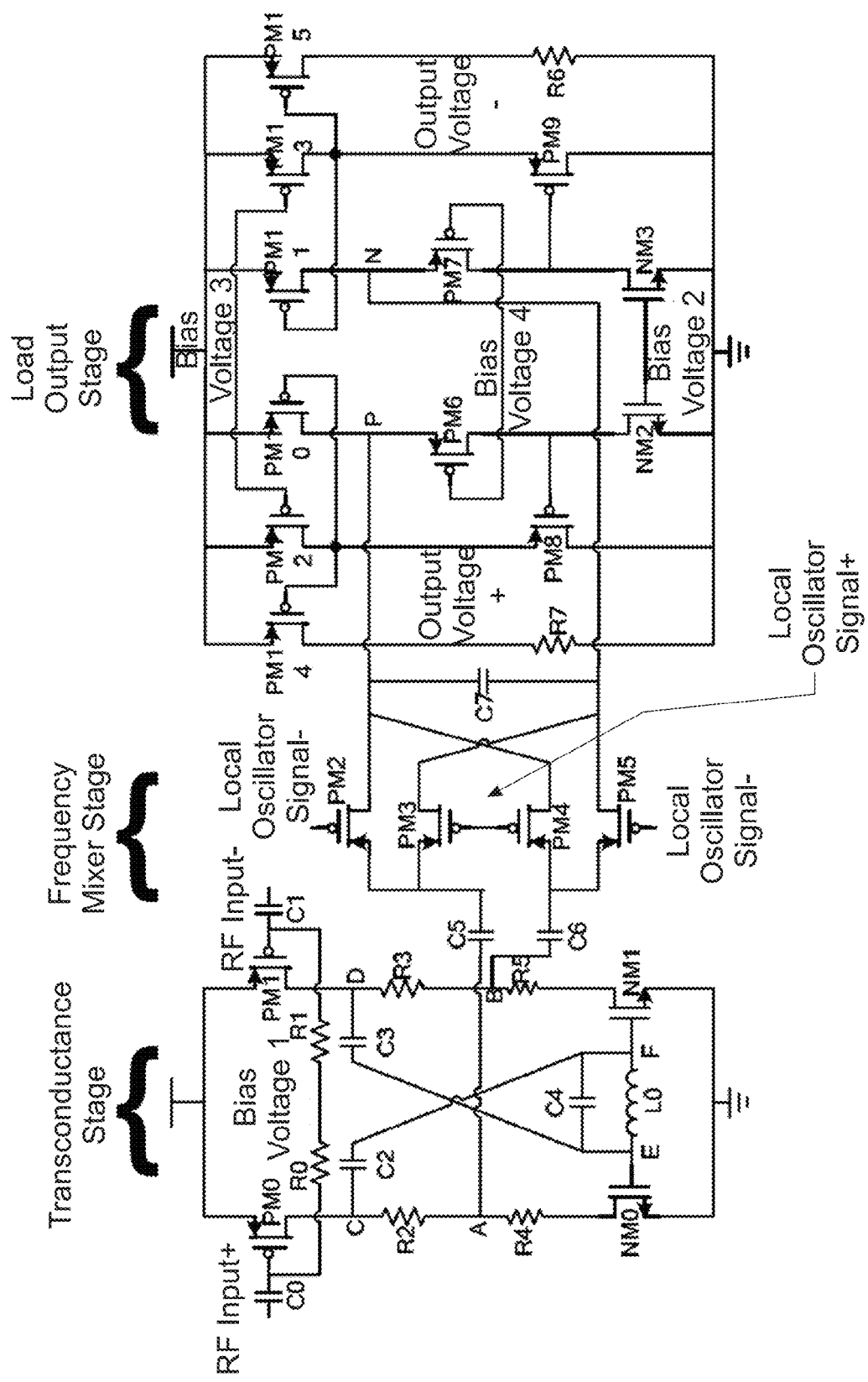
FIG. 2 is a schematic circuit diagram of the transconductance enhanced passive frequency mixer of the present invention.
Figure 3:
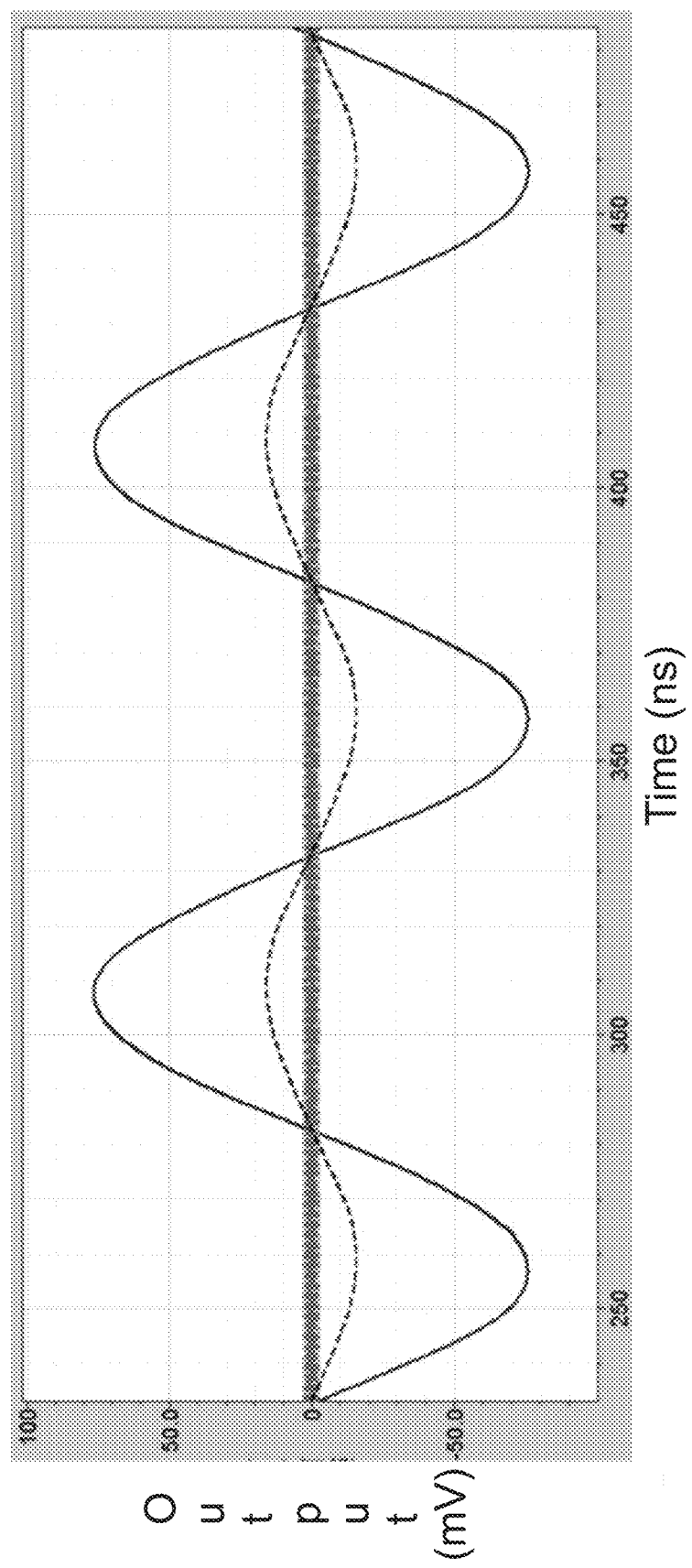
FIG. 3 shows the waveform of input RF signal (curve in low color), waveform at the output terminal without transconductance gain structure (low-amplitude low frequency sinusoidal wave), and waveform at the output terminal with transconductance gain structure (high-amplitude low frequency sinusoidal wave).

The transconductance stage of the transconductance enhanced passive frequency mixer can increase the RF current converted from RF input voltage. The main working principle is: the current is multiplied with the local oscillator signal via a passive dual balance switch pair, so as to accomplish frequency mixing function. The switch stage employs a passive frequency mixing method, and does not have static power consumption, and eliminates flicker noise from switch stage. The output stage employs transconductance enhancement technology, and can generate low input impedance in the output frequency band; the IF current obtained through frequency mixing is completely drawn into the load stage, and finally IF output voltage is generated in the output load by means of a current mirror. The output terminal of the frequency mixer stage is connected to a capacitor, so that the output terminal is equivalent to AC ground for the RF signal from the transconductance stage; thus, the RF current generated in the transconductance stage can be drawn into the frequency mixing switch as much as possible. The transimpedance stage has low input impedance, and the IF voltage fluctuation at the input terminal of the transimpedance stage is very low; thus, voltage feeding of IF signal to the output terminal of transconductance stage is reduced, the output voltage of transconductance stage is stabilized, and current utilization and linearity are improved. The transconductance enhanced passive frequency mixer described above has advantages such as high transconductance in the transconductance stage, low power consumption, and high conversion gain.

The main structure of the transconductance enhanced passive frequency mixer disclosed in the present invention comprises a transconductance enhanced transconductance/amplifier stage, a passive mixer stage, a load output stage, and a bias circuit, etc. The transconductance/amplifier stage comprises P-channel metal oxide field-effect transistors (hereinafter referred to as PMOS transistors) PM0 and PM1, and N-channel metal oxide field-effect transistors (hereinafter referred to as NMOS transistors) NM0 and NM1, and cross-coupled capacitor and LC resonant circuits. The bias voltages of PM0 and PM1 are obtained from bias voltage 1 via R0 and R1 respectively. L0, C2, C3, and C4 are used to enhance transconductance; the output RF currents of the transconductance stage are led out between R2 and R4 and between R3 and R5 respectively. The currents are coupled to the frequency mixing switch stage via C5 and C6 respectively; in the frequency mixer stage, PM2-PM5 is used as the core circuit, and the results after frequency mixing are outputted from the drain electrodes of PM2 and PM5, wherein, the drain electrodes of PM2 and PM4 are short connected, and the drain electrodes of PM3 and PM5 are short connected. The load output stage mainly comprises PM6-PM15 and NM2-NM3. PM6, PM7, PM10, PM11, NM2, and NM3 constitute the first stage differential amplification circuit of the load output stage, and the bias of NM2 and NM3 are provided by bias voltage 2. The stages are outputted from the drain terminals of PM6 and PM7, and connected to a second stage of differential source follower constituted by PM8, PM9, PM12, and PM13; then, the signals are outputted from the drain electrodes of PM12 and PM13, and connected to a third stage of differential common-source amplification circuit constituted by PM14, PM15, R6, and R7; finally, IF signals are outputted from the drain terminals of PM14 and PM15.

The upper plates of capacitors C0 and C1 are connected to the positive input signal terminal and negative input signal terminal respectively. The lower plate of C0 is connected to the gate electrode of PM0; the lower plate of C1 is connected to the gate electrode of PM1; the upper plate of capacitor C2 is connected to the drain terminal of PM0, the upper plate of capacitor C3 is connected to the drain terminal of PM1, the lower plate of C2 is connected to the lower plate of C4, the lower plate of C3 is connected to the upper plate of C4, the upper plate of C4 is connected to the positive terminal of L0, the lower plate of C4 is connected to the negative terminal of L0, the positive terminal of L0 and the upper plate of C4 are connected to the gate electrode of NM1, and the negative terminal of L0 and the lower plate of C4 are connected to the gate electrode of NM0; the source electrodes of PM0 and PM1 are connected to the supply voltage, the positive terminal of resistor R0 is connected to the gate electrode of PM0, the negative terminal of R0 is connected to the positive terminal of resistor R1, and the negative terminal of R1 is connected to the gate electrode of PM1. The positive terminal of resistor R2 is connected to the drain terminal of PM0, the negative terminal of R2 is connected to the positive terminal of R4, and the negative terminal of R4 is connected to the drain electrode of NM0; the positive terminal of resistor R3 is connected to the drain terminal of PM1, the negative terminal of R3 is connected to the positive terminal of R5, and the negative terminal of R5 is connected to the drain electrode of NM1. The source electrodes of NM0 and NM1 are grounded. The upper plate of RF coupling capacitor C5 is connected to the negative terminal of R2 and positive terminal of R4, the upper plate of RF coupling capacitor C6 is connected to the negative terminal of R3 and positive terminal of R5, the lower plate of C5 is connected to the source electrodes of PM2 and PM3, and the lower plate of C6 is connected to the source electrodes of PM4 and PM5. The positive terminal of local oscillator signal is connected to the gate electrodes of PM3 and PM4, and the negative terminal of local oscillator signal is connected to the gate electrodes of PM2 and PM5. The drain electrodes of PM2 and PM4 are connected to the upper plate of C7, and the drain electrodes of PM3 and PM5 are connected to the lower plate of C7. The positive output of the switch stage (i.e., the upper plate of C7) is connected to the source electrode of PM6 and drain electrode of PM10 in the load stage, the negative output of the switch stage (i.e., the lower plate of C7) is connected to the source electrode of PM7 and drain electrode of PM11 in the load stage. The gate electrodes of PM6 and PM7 are connected to bias voltage 4 for bias; the drain electrode of PM6 is connected to the drain electrode of NM2 and gate electrode of PM8; the drain electrode of PM7 is connected to the drain electrode of NM3 and gate electrode of PM9; the drain electrodes of PM8 and PM9 are grounded, forming a source follower; the source electrodes of NM2 and NM3 are grounded, and the gate electrodes of NM2 and NM3 are connected to bias voltage 2 for bias. The source electrodes of PM10-PM15 are connected to the supply voltage; the source electrode of PM8 is connected to the drain electrode of PM12 and gate electrode of PM14; the source electrode of PM9 is connected to the drain electrode of PM13 and gate electrode of PM15; the drain electrode of PM14 serves as the positive terminal of output voltage and is connected to the positive terminal of resistor R7, and the negative terminal of resistor R7 is grounded; the drain electrode of PM15 serves as the negative terminal of output voltage and is connected to the positive terminal of resistor R8, and the negative terminal of R8 is grounded.

While the present invention has been illustrated and described with reference to some preferred embodiments, the present invention is not limited to these. Those having ordinary skills in the art should recognize that various variations and modifications can be made without departing from the spirit and scope of the present invention as defined by the accompanying claims.

The invention claimed is:

1. A transconductance enhanced passive frequency mixer, comprising a transconductance stage with enhanced transconductance, a passive frequency mixing switch pair, and an output transresistance amplifier, wherein, the transconductance stage employs a pre-amplified transconductance enhancement structure with enhanced transconductance and converts input RF voltage into RF currents, which is frequency mixed via a dual balanced frequency mixing switch pair, and then converted into IF voltage output via a transconductance enhanced load output stage after frequency mixing; a transconductance/amplifier stage, a frequency mixer stage, a bias circuit, and a load output stage; the transconductance/amplifier stage comprises P-channel metal oxide field-effect transistors (hereinafter referred to as PMOS transistors) PM0 and PM1, and N-channel metal oxide field-effect transistors (hereinafter referred to as NMOS transistors) NM0 and NM1, and cross-coupled capacitor and LC resonant circuits; the bias voltages of PM0 and PM1 are obtained from bias voltage 1 via resisters R0 and R1 respectively; circuit components L0, C2, C3, and C4 are used to enhance transconductance; the RF currents output from the transconductance stage are led out between resisters R2 and R4 and between resisters R3 and R5 respectively; the currents are coupled to the frequency mixing switch stage via circuit components C5 and C6 respectively; in the mixer stage, PMOS transistors PM2-PM5 being used as a core circuit, and the frequency mixing results are outputted from the drain electrodes of PMOS transistors PM2 and PM5, wherein, the drain electrodes of PMOS transistors PM2 and PM4 are short connected, and the drain electrodes of PMOS transistors PM3 and PM5 are short connected; the load output stage mainly comprises PMOS transistors PM6-PM15 and NMOS transistors NM2-NM3; PM6, PM7, PM10, PM11, NM2, and NM3 constitute the first stage differential amplification circuit of the load output stage, and the bias of NM2 and NM3 is provided by bias voltage 2; the electrodes are outputted from the drain terminals of PM6 and PM7, and connected to a second stage of differential source follower constituted by PM8, PM9, PM12, and PM13; then, the signals are outputted from the drain electrodes of PM12 and PM13, and connected to a third stage of differential common-source amplification circuit constituted by PM14, PM15, R6, and R7; finally, IF signals are outputted from the drain terminals of PM14 and PM15; the upper plates of capacitors C0 and C1 are connected to the positive input signal terminal and negative input signal terminal respectively; the lower plate of C0 is connected to the gate electrode of PM0; the lower plate of C1 is connected to the gate electrode of PM1; the upper plate of capacitor C2 is connected to the drain terminal of PM0, the upper plate of capacitor C3 is connected to the drain terminal of PM1, the lower plate of C2 is connected to the lower plate of C4, the lower plate of C3 is connected to the upper plate of C4, the upper plate of C4 is connected to the positive terminal of L0, the lower plate of C4 is connected to the negative terminal of L0, the positive terminal of L0 and the upper plate of C4 are connected to the gate electrode of NM1, and the negative terminal of L0 and the lower plate of C4 are connected to the gate electrode of NM0; the source electrodes of PM0 and PM1 are connected to the supply voltage, the positive terminal of resistor R0 is connected to the gate electrode of PM0, the negative terminal of R0 is connected to the positive terminal of resistor R1, and the negative terminal of R1 is connected to the gate electrode of PM1; the positive terminal of resistor R2 is connected to the drain terminal of PM0, the negative terminal of R2 is connected to the positive terminal of R4, and the negative terminal of R4 is connected to the drain electrode of NM0; the positive terminal of resistor R3 is connected to the drain terminal of PM1, the negative terminal of R3 is connected to the positive terminal of R5, and the negative terminal of R5 is connected to the drain electrode of NM1; the source electrodes of NM0 and NM1 are grounded; the upper plate of RF coupling capacitor C5 is connected to the negative terminal of R2 and positive terminal of R4, the upper plate of RF coupling capacitor C6 is connected to the negative terminal of R3 and positive terminal of R5, the lower plate of C5 is connected to the source electrodes of PM2 and PM3, and the lower plate of C6 is connected to the source electrodes of PM4 and PM5; the positive terminal of local oscillator signal is connected to the gate electrodes of PM3 and PM4, and the negative terminal of local oscillator signal is connected to the gate electrodes of PM2 and PM5; the drain electrodes of PM2 and PM4 are connected to the upper plate of C7, and the drain electrodes of PM3 and PM5 are connected to the lower plate of C7; the positive output of the switch stage (i.e., the upper plate of C7) is connected to the source electrode of PM6 and drain electrode of PM10 in the load stage, the negative output of the switch stage (i.e., the lower plate of C7) is connected to the source electrode of PM7 and drain electrode of PM11 in the load stage; the gate electrodes of PM6 and PM7 are connected to bias voltage 4 for bias; the drain electrode of PM6 is connected to the drain electrode of NM2 and gate electrode of PM8; the drain electrode of PM7 is connected to the drain electrode of NM3 and gate electrode of PM9; the drain electrodes of PM8 and PM9 are grounded, forming a source follower; the source electrodes of NM2 and NM3 are grounded, and the gate electrodes of NM2 and NM3 are connected to bias voltage 2 for bias; the source electrodes of PM10-PM15 are connected to the supply voltage; the source electrode of PM8 is connected to the drain electrode of PM12 and gate electrode of PM14; the source electrode of PM9 is connected to the drain electrode of PM13 and gate electrode of PM15; the drain electrode of PM14 serves as the positive terminal of output voltage and is connected to the positive terminal of resistor R7, and the negative terminal of R7 is grounded; the drain electrode of PM15 serves as the negative terminal of output voltage and is connected to the positive terminal of resistor R8, and the negative terminal of R8 is grounded.

2. A transconductance enhanced passive frequency mixer comprising:
  a transconductance amplification stage employing a pre-amplified transconductance enhancement structure to enhance transconductance;
  a passive frequency mixing switch pair;
  a transconductance enhanced load output stage;
  a transconductance/amplifier stage including:
    a plurality of P-channel metal oxide field-effect transistors (hereinafter referred to as PMOS transistors);
    a plurality of N-channel metal oxide field-effect transistors (hereinafter referred to as NMOS transistors); and
    a cross-coupled capacitor and LC resonant circuits, wherein the bias voltages of first and second PMOS transistors (PM0 and PM1) are obtained from bias voltage (1) via first and second resisters (R0 and R1), respectively;
  a frequency mixer stage;
  a bias circuit; and
  a load output stage;
  wherein, the transconductance stage with enhanced transconductance converts input RF voltage into RF currents, which is frequency mixed via said passive frequency mixing switch pair, and then converted into IF voltage output via said transconductance enhanced load output stage after frequency mixing.

3. The transconductance enhanced passive frequency mixer according to claim 2 wherein a first set of circuit components (L0, C2, C3, and C4) are used to enhance transconductance, the RF currents output from the transconductance stage are led out between third and fourth resisters (R2 and R4) and between fifth and sixth resisters (R3 and R5), respectively, the RF currents being coupled to the frequency mixer stage via a second set of circuit components (C5 and C6) respectively; in the frequency mixer stage.

4. The transconductance enhanced passive frequency mixer according to claim 3 wherein PMOS transistors (PM2-PM5) are used as a core circuit, and the frequency mixing results are outputted from the drain electrodes of selected PMOS transistors (PM2 and PM5), wherein, the drain electrodes of a first pair of PMOS transistors (PM2 and PM4) are short connected, and the drain electrodes of a second pair of PMOS transistors (PM3 and PM5) are also short connected.

5. The transconductance enhanced passive frequency mixer according to claim 4 wherein the load output stage mainly comprises selected PMOS transistors (PM6-PM15) and selected NMOS transistors (NM2-NM3), four of the PMOS transistors (PM6, PM7, PM10, PM11) and two of the NMOS transistors (NM2, and NM3) constitute the first stage differential amplification circuit of the load output stage, and the bias of the two NMOS transistors (NM2 and NM3) is provided by bias voltage (2).

6. The transconductance enhanced passive frequency mixer according to claim 5 wherein the electrodes are outputted from the drain terminals of PMOS transistors (PM6 and PM7) and connected to a second stage of differential source follower constituted by PMOS transistors (PM8, PM9, PM12, and PM13), the signals are then outputted from the drain electrodes of PMOS transistors (PM12 and PM13) and connected to a third stage of differential common-source amplification circuit constituted by PMOS transistors (PM14, PM15), and seventh and eighth resistors (R6, and R7), IF signals being outputted from the drain terminals of PMOS transistors (PM14 and PM15).

7. The transconductance enhanced passive frequency mixer according to claim 6 wherein the upper plates of two capacitors (C0 and C1) are connected to the positive input signal terminal and negative input signal terminal, respectively, the lower plate of capacitor (C0) being connected to the gate electrode of PMOS transistor (PM0), the lower plate of capacitor (C1) being connected to the gate electrode of PMOS transistor (PM1), while the upper plate of capacitor (C2) is connected to the drain terminal of PMOS transistor (PM0), the upper plate of capacitor (C3) is connected to the drain terminal of PMOS transistor (PM1), the lower plate of capacitor (C2) is connected to the lower plate of capacitor (C4), the lower plate of capacitor (C3) is connected to the upper plate of capacitor (C4), the upper plate of capacitor (C4) is connected to the positive terminal of circuit component (L0), the lower plate of capacitor (C4) is connected to the negative terminal of circuit component (L0), the positive terminal of circuit component (L0) and the upper plate of capacitor (C4) are connected to the gate electrode of NMOS transistor (NM1), and the negative terminal of circuit component (L0) and the lower plate of capacitor (C4) are connected to the gate electrode of NMOS transistor (NM0).

8. The transconductance enhanced passive frequency mixer according to claim 7 wherein the source electrodes of PMOS transistors (PM0 and PM1) are connected to the supply voltage, the positive terminal of resistor (R0) is connected to the gate electrode of PMOS transistor (PM0), the negative terminal of resistor (R0) is connected to the positive terminal of resistor (R1), and the negative terminal of resistor (R1) is connected to the gate electrode of PMOS transistor (PM1).

9. The transconductance enhanced passive frequency mixer according to claim 8 wherein the positive terminal of resistor (R2) is connected to the drain terminal of PMOS transistor (PM0), the negative terminal of resistor (R2) is connected to the positive terminal of resistor (R4), and the negative terminal of resistor (R4) is connected to the drain electrode of NMOS transistor (NM0).

10. The transconductance enhanced passive frequency mixer according to claim 9 wherein the positive terminal of resistor (R3) is connected to the drain terminal of PMOS transistor (PM1), the negative terminal of resistor (R3) is connected to the positive terminal of resistor (R5), and the negative terminal of resistor (R5) is connected to the drain electrode of NMOS transistor (NM1).

11. The transconductance enhanced passive frequency mixer according to claim 10 wherein the source electrodes of NMOS transistors (NM0 and NM1) are grounded, the upper plate of RF coupling capacitor (C5) is connected to the negative terminal of resistor (R2) and the positive terminal of resistor (R4), the upper plate of RF coupling capacitor (C6) is connected to the negative terminal of resistor (R3) and positive terminal of resistor (R5), the lower plate of capacitor (C5) is connected to the source electrodes of PMOS transistors (PM2 and PM3), and the lower plate of capacitor (C6) is connected to the source electrodes of PMOS transistors (PM4 and PM5).

12. The transconductance enhanced passive frequency mixer according to claim 11 wherein the positive terminal of local oscillator signal is connected to the gate electrodes of PMOS transistors (PM3 and PM4), and the negative terminal of local oscillator signal is connected to the gate electrodes of PMOS transistors (PM2 and PM5), the drain electrodes of PMOS transistors (PM2 and PM4) are connected to the upper plate of capacitor (C7), and the drain electrodes of PMOS transistors (PM3 and PM5) are connected to the lower plate of capacitor (C7).

13. The transconductance enhanced passive frequency mixer according to claim 12 wherein the positive output of the upper plate of capacitor (C7) is connected to the source electrode of PMOS transistor (PM6) and the drain electrode of PMOS transistor (PM10) in the load stage, the negative output of the lower plate of capacitor (C7) is connected to the source electrode of PMOS transistor (PM7) and the drain electrode of PMOS transistor (PM11) in the load stage; the gate electrodes of PMOS transistors (PM6 and PM7) are connected to bias voltage (4) for bias, the drain electrode of PMOS transistor (PM6) is connected to the drain electrode of NMOS transistor (NM2) and the gate electrode of PMOS transistor (PM8), the drain electrode of PMOS transistor (PM7) is connected to the drain electrode of NMOS transistor (NM3) and the gate electrode of PMOS transistor (PM9).

14. The transconductance enhanced passive frequency mixer according to claim 13 wherein the drain electrodes of PMOS transistors (PM8 and PM9) are grounded to form a source follower, the source electrodes of NMOS transistors (NM2 and NM3) are grounded, and the gate electrodes of NMOS transistors (NM2 and NM3) are connected to bias voltage (2) for bias.

15. The transconductance enhanced passive frequency mixer according to claim 14 wherein the source electrodes of PMOS transistors (PM10-PM15) are connected to the supply voltage, the source electrode of PMOS transistor (PM8) is connected to the drain electrode of PMOS transistor (PM12) and the gate electrode of PMOS transistor (PM14); the source electrode of PMOS transistor (PM9) is connected to the drain electrode of PMOS transistor (PM13) and the gate electrode of PMOS transistor (PM15); the drain electrode of PMOS transistor (PM14) serves as the positive terminal of the output voltage and is connected to the positive terminal of resistor (R7), and the negative terminal of resistor (R7) is grounded.

* * * * *